(12) United States Patent
Lo Verde et al.

(10) Patent No.: US 11,942,930 B2
(45) Date of Patent: Mar. 26, 2024

(54) FIELD-EFFECT TRANSISTOR (FET) BASED SYNCHRONOUS RECTIFIER FOR EMULATING DIODE

(71) Applicant: Steifpower Technology Company Limited, Hong Kong (CN)

(72) Inventors: Domenico Lo Verde, Hong Kong (CN); Cesare Ronsisvalle, Hong Kong (CN); Chi Ping Tang, Hong Kong (CN)

(73) Assignee: Steifpower Technology Company Limited, Hong Kong (CN)

( * ) Notice: Subject to any disclaimer, the term of this patent is extended or adjusted under 35 U.S.C. 154(b) by 194 days.

(21) Appl. No.: 17/597,322

(22) PCT Filed: Sep. 29, 2020

(86) PCT No.: PCT/CN2020/118694
§ 371 (c)(1),
(2) Date: Jan. 3, 2022

(87) PCT Pub. No.: WO2021/068792
PCT Pub. Date: Apr. 15, 2021

(65) Prior Publication Data
US 2022/0360262 A1 Nov. 10, 2022

(30) Foreign Application Priority Data
Oct. 10, 2019 (HK) .............................. 19130644.8

(51) Int. Cl.
*H03K 17/30* (2006.01)
*H01L 27/06* (2006.01)
(52) U.S. Cl.
CPC ....... *H03K 17/302* (2013.01); *H01L 27/0629* (2013.01); *H03K 2017/307* (2013.01)

(58) Field of Classification Search
CPC ............ H03K 17/302; H03K 2017/307; H01L 27/0629
See application file for complete search history.

(56) References Cited

U.S. PATENT DOCUMENTS

| 10,050,553 | B2 * | 8/2018 | Baur ................ H03K 17/08142 |
| 2002/0141214 | A1 | 10/2002 | Grover |
| 2016/0315553 | A1 * | 10/2016 | Ishimaru .............. H03K 17/302 |

FOREIGN PATENT DOCUMENTS

| CN | 1378285 A | 11/2002 |
| CN | 105814786 A | 7/2016 |

(Continued)

OTHER PUBLICATIONS

Office Action of TW109134588 issued from the Taiwan Intellectual Property Office dated Jan. 31, 2023.
(Continued)

*Primary Examiner* — Ryan Johnson
*Assistant Examiner* — Colleen J O Toole
(74) *Attorney, Agent, or Firm* — S&F/WEHRW

(57) ABSTRACT

A field-effect transistor (FET) based synchronous rectifier for emulating a diode, comprising: a first terminal (20) and a second terminal (30); a first FET (M1) and a second FET (M2), wherein the second FET (M2) is adapted to control operation of the first FET (M1) to thereby allow unidirectional current flow when the two terminals (20, 30) are connected with an external circuit; and wherein the FET based synchronous rectifier comprises a fully integrated single-chip device (10) adapted to emulate a diode.

17 Claims, 9 Drawing Sheets

(56) References Cited

FOREIGN PATENT DOCUMENTS

GB          1589599 A    5/1981
TW        200501531 A    1/2005

OTHER PUBLICATIONS

Search Report of UK patent application No. GB1914800.6 issued from the UKIPO dated Feb. 6, 2020.
International Search Report and Written Opinion of PCT application No. PCT/CN2020/118694 issued from the International Search Authority dated Dec. 31, 2020.

* cited by examiner

FIELD-EFFECT TRANSISTOR (FET) BASED SYNCHRONOUS RECTIFIER FOR EMULATING DIODE

CROSS-REFERENCE TO RELATED APPLICATIONS

This application claims the benefit of the Hong Kong Short Term Patent Application No. 19130644.8, filed on 10 Oct. 2019, which is incorporated by reference herein in its entirety.

TECHNICAL FIELD

The invention relates to a field-effect transistor (FET) based electronic component and/or device and particularly, but not exclusively, to a metal-oxide-semiconductor field-effect transistor (MOSFET) based electronic component and/or device.

BACKGROUND

Various electronic components including diodes in different configurations are known in the field. Diodes can be found in various electronic applications, where a unidirectional current flow is required. A typical diode comprises two terminals, namely the cathode and the anode, between which it demonstrates a low, or ideally, close to zero resistance in one direction and a high, or ideally, close to infinite resistance in the other direction. FIG. 1 illustrates a well-known type of semiconductor diode having a p-type semiconductor forming the anode, and a n-type semiconductor forming the cathode and a p-n junction in between.

Like many other electronic components, a diode demonstrates energy loss during operation, and one major parameter which determines energy loss of a diode is the forward voltage drop ($V_f$). According to the Ohm's law, the power dissipated ($P_d$) by a diode can be represented by:

$P_d$(Power dissipated from the diode)=$V_f$(Forward voltage)*$I_f$(Forward current)

The power dissipated ($P_d$) is directly proportional to the forward voltage ($V_f$), and therefore, it is desirable to have a diode with a low forward voltage drop ($V_f$) to thereby reduce power loss. The loss in power from a diode, which is mostly dissipated in the form of heat, is undesirable not only because it is a waste of energy, but also because the dissipated heat may damage the electronic circuit, which is potentially hazardous.

A number of electronic components and/or circuit designs have thus been developed with an aim to lower the forward voltage drop ($V_f$). One example is the use of a Schottky barrier with the diode, as shown in FIG. 2, in which a Schottky metal barrier is provided at the metal contact comprising, in this instance, the anode. Although the Schottky diode is known to provide a satisfactory reduction in the forward voltage ($V_f$), it demonstrates significant reverse current leakage ($I_r$), i.e. the current allowed to flow through the diode during a reverse polarization phase. Another example is the use of a metal-oxide-semiconductor field-effect transistor (MOSFET) in a synchronous rectification configuration to emulate the function of a diode, as shown in FIG. 3. The MOSFET synchronous rectifier provides a relatively lower $V_f$, however, the typical MOSFET synchronous rectification circuit requires a large number of discrete electronic components in a sophisticated configuration, which results in a bulky structure, as well as complicated and expensive processing and/or assembling steps, which are undesirable.

SUMMARY OF THE INVENTION

An object of the present invention is to provide a novel FET based electronic component for emulating the function of a diode.

Another object of the present invention is to mitigate or obviate to some degree one or more problems associated with known diode structures, or at least to provide a useful alternative.

The above objects are met by the combination of features of the main claim; the sub-claims disclose further advantageous embodiments of the invention.

One skilled in the art will derive from the following description other objects of the invention. Therefore, the foregoing statements of object are not exhaustive and serve merely to illustrate some of the many objects of the present invention.

The invention provides a field-effect transistor (FET) based synchronous rectifier, comprising: a first terminal and a second terminal; a first FET (M1) and a second FET (M2), wherein the second FET (M2) is adapted to control operation of the first FET (M1) to thereby allow unidirectional current flow when the two terminals are connected with an external circuit; and wherein the FET based synchronous rectifier comprises a fully integrated single-chip device adapted to emulate a diode.

The summary of the invention does not necessarily disclose all the features essential for defining the invention; the invention may reside in a sub-combination of the disclosed features.

BRIEF DESCRIPTION OF THE DRAWINGS

The foregoing and further features of the present invention will be apparent from the following description of preferred embodiments which are provided by way of example only in connection with the accompanying figure, of which:

FIG. 5b is a circuit diagram showing the cross-sectional view of FIG. 5a;

DETAILED DESCRIPTION OF THE INVENTION

The following description is of preferred embodiments by way of example only and without limitation to the combination of features necessary for carrying the invention into effect.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

The present invention relates to a field-effect transistor (FET), and particularly, but not exclusively, to a metal-oxide-semiconductor field-effect transistor (MOSFET) based synchronous rectifier in the form of a fully-integrated, single chip device for emulating the function of a diode. Particularly, the present invention provides a structurally simple, on-chip device by integrating in a single chip all the required, active and passive, electronic components generally associated with a synchronous rectifier diode. In one embodiment, the fully integrated single-chip device may comprise equal to or less than 15 discrete electronic devices or components integrated in said chip. The fully-integrated chip device of the present invention can be applied to and/or assembled in any standard or non-standard electronic packages and/or applications so as to function as a diode chip with a significantly lower forward voltage ($V_f$) drop achievable when compared to the available diode products in the market.

Figure 4:
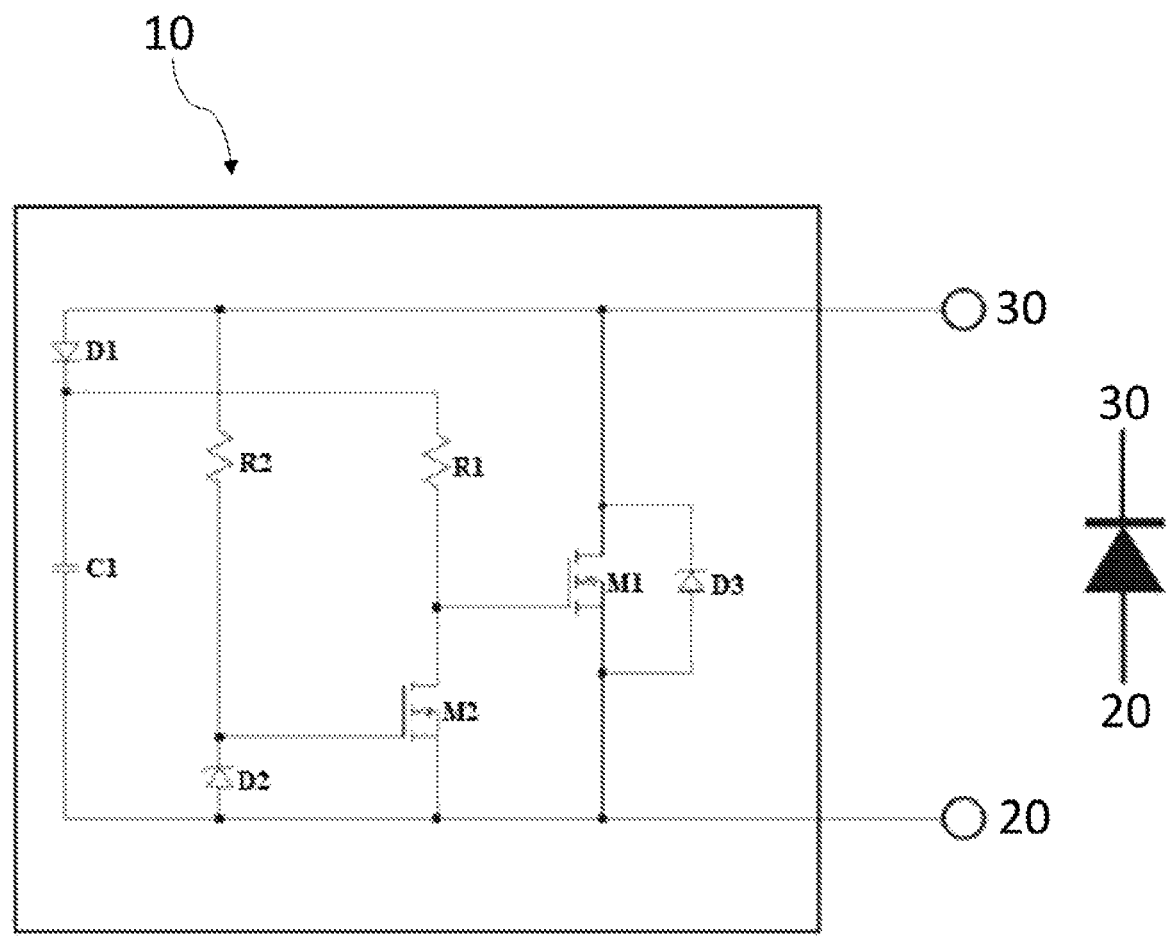
FIG. 4 is a circuit diagram showing a MOSFET based synchronous rectifier in the form of a fully-integrated, single chip device for diode emulation in accordance with an embodiment of the present invention.

Referring to FIG. 4, shown is a circuit diagram of an embodied metal-oxide-semiconductor field-effect transistor (MOSFET) based synchronous rectifier provided in the form of a fully-integrated, single chip device 10 for emulating the function of a diode in accordance with the present invention. In this embodiment, the fully-integrated chip device 10 comprises two terminals 20, 30 comprising a first terminal which comprises an anode 20, and a second terminal which comprises a cathode 30. The chip 10 further comprises a first FET such as a first MOSFET (M1) and a second FET such as a second MOSFET (M2). Specifically, the second MOSFET (M2) is adapted to control operation of the first MOSFET (M1) to thereby allow unidirectional current flow when the two terminals 20, 30 are connected with an external circuit for emulating a diode.

Preferably, the first terminal, i.e. the anode 20, is provided on a first or top metal surface of the fully integrated single-chip device 10, and the second terminal, i.e. the cathode 30, is provided on a second or bottom metal surface of the fully integrated single-chip device 10. More preferably, the single-chip device 10 has only two terminals 20, 30, i.e. the anode 20 at the top surface and the cathode 30 at the bottom surface for the integrated, single-chip device 10 to function as a diode.

In this embodiment, the first MOSFET (M1) and the second MOSFET (M2) are integrated in the single-chip device 10 such that the second MOSFET (M2) comprises a driver for the first MOSFET (M1) to enable said first MOSFET (M1) to operate as a synchronous rectifier. Detailed structure and functionalities of the embodied on-chip device 10 as shown in FIG. 4 will be discussed further in the following description.

Like most MOSFETs, the first MOSFET (M1) of the present invention has at least a first gate electrode, a first source electrode and a first drain electrode; and the second MOSFET (M2) has at least a second gate electrode, a second source electrode and a second drain electrode. In the embodiment as shown in FIG. 4, the second drain electrode of the second MOSFET (M2) is connected in series with the first gate electrode of the first MOSFET (M1).

To allow the integrated chip device 10 to function as a diode, the second MOSFET (M2) is configured to stay on when a voltage at the first drain electrode of the first MOSFET (M1) is positive, and the second MOSFET (M2) is configured to keep off when a voltage at the first drain electrode of the first FET (M1) is negative. This provides a clear difference in terms of operating principle from the prior art MOSFET based diode structures: the fully-integrated chip device 10 utilizes M2 to control M1 to operate as a synchronous rectifier MOSFET, while the other MOSFET solutions in the prior art require control of the synchronous rectifier MOSFET with at least one separate, operational integrated circuit that comprises a very large number of other, discrete electronic components electrically connected thereto which has considerable assembly and cost implications.

Preferably, the circuit of the chip device 10 of the present invention can be configured by having the second source electrode of the second MOSFET (M2) and the first source electrode of the first MOSFET (M1) connected with the anode 20; and the first drain electrode of the first MOSFET (M1) connected with the cathode 30. More preferably, the chip device 10 may further comprise a first diode (D1) and a first resistor (R1) connected in series between the second drain electrode of the second MOSFET (M2) and the cathode 30; a first capacitor (C1) connected in series between the first diode (D1) and the second source electrode of the second MOSFET (M2); and a second resistor (R2) and a second diode (D2) connected in parallel with the first capacitor (C1) and the first diode (D1) in between the anode 20 and the cathode 30. More preferably, the second resistor (R2) is connected in series with the second gate electrode of the second MOSFET (M2); and the circuit may further comprise a third diode (D3) connected in parallel with the first MOSFET (M1), as shown in FIG. 4.

In one embodiment, the integrated capacitor (C1) is adapted to serve as a voltage or a current pump, such that the capacitor (C1) will be charged in the beginning of the input sinusoidal waveforms, and that the voltage charged will be used by the second MOSFET (M2) to drive operation of the first MOSFET (M1).

Figure 5A:
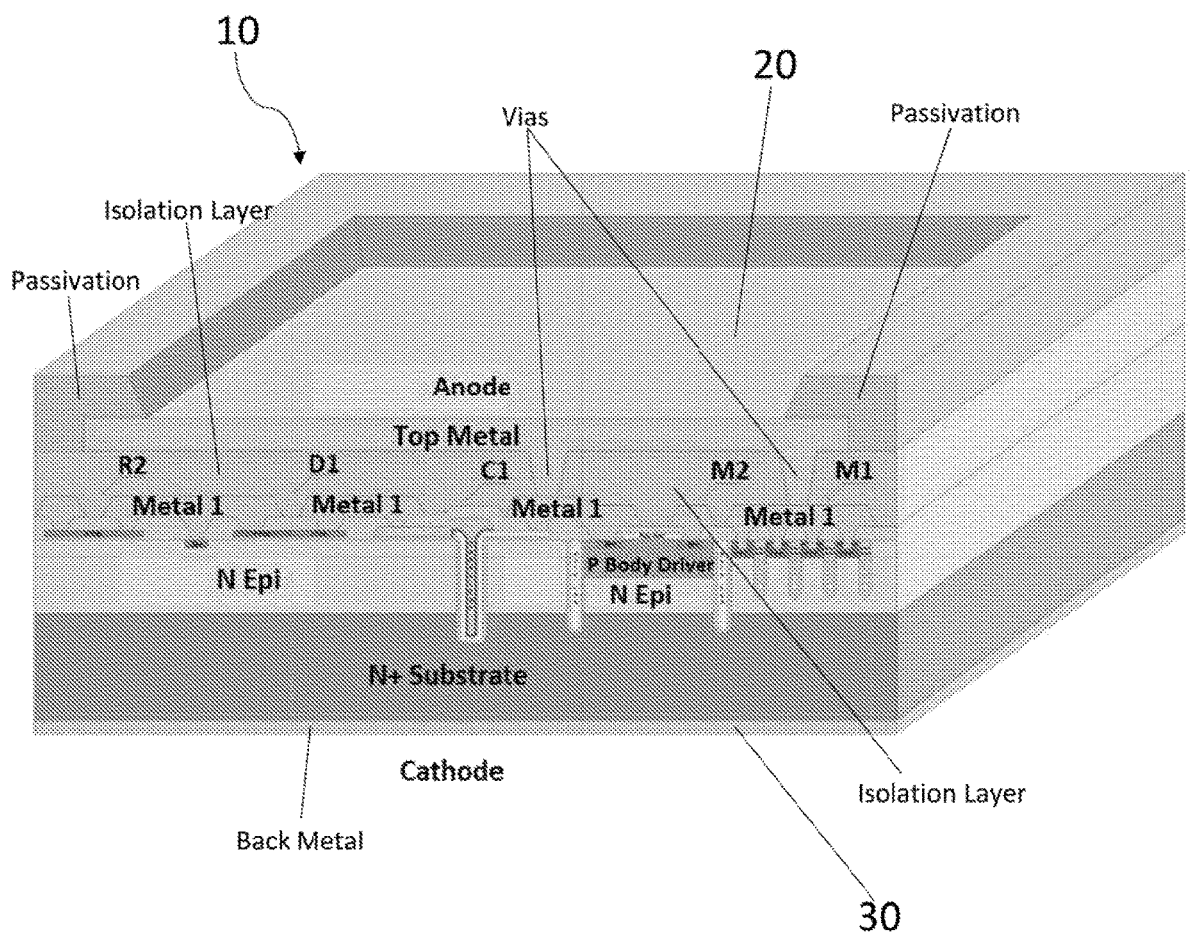
FIG. 5a is a cross-sectional, schematic diagram showing the chip device of FIG. 4.
Figure 5B:
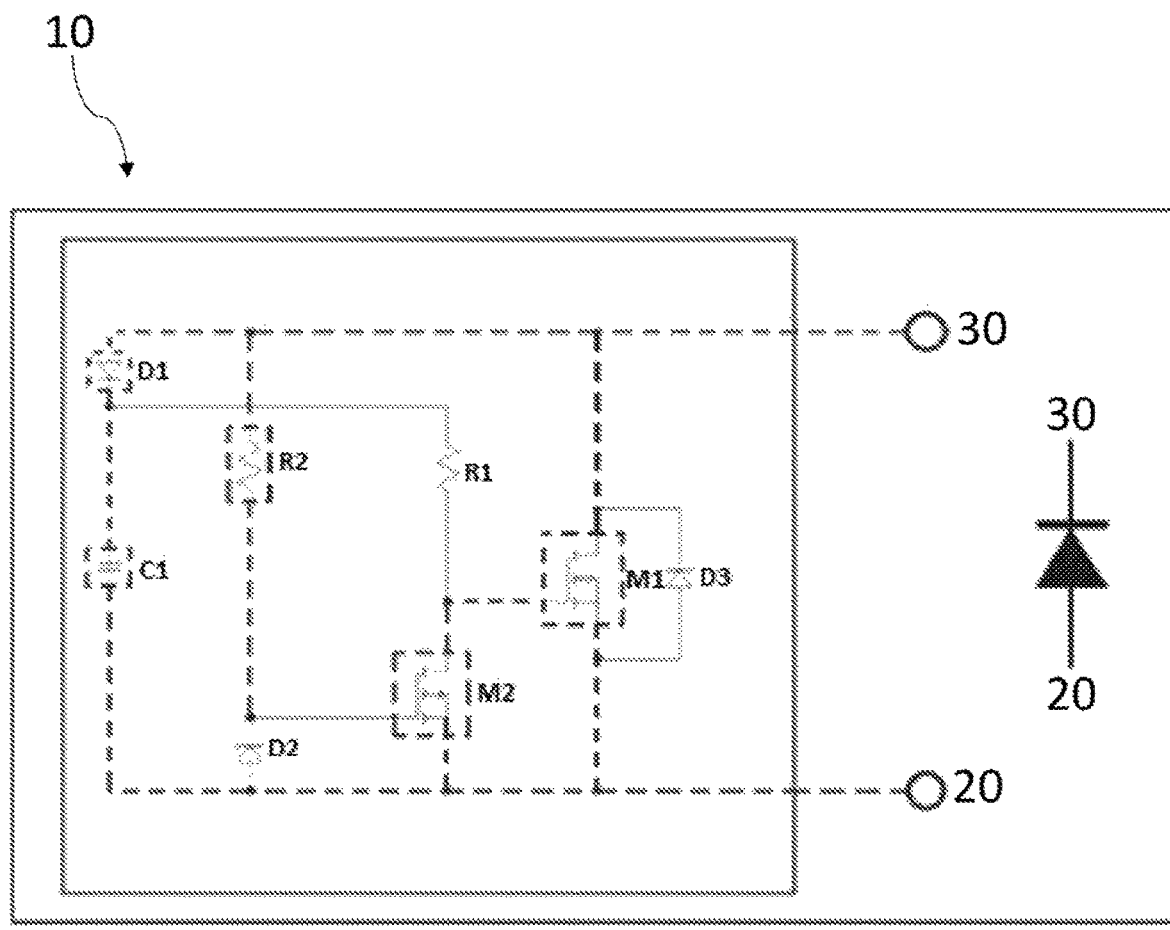

FIG. 5a further illustrates a schematic diagram of a cross-section of the fully-integrated, on-chip device 10; with FIG. 5b showing, in dashed lines, the components as shown in the cross-sectional view, and their interconnections in the form of a circuit diagram.

The fully integrated single-chip device 10, when operated to emulate a diode, does not require connection with any one or more of an external power FET and/or a control integrated circuit (IC) having one or more active and/or passive electronic components to control the MOSFETs. This is in contrast to the MOSFET synchronous rectifiers in the prior art, which generally require at least one or more of an external power MOSFET, a control integrated circuit and/or a number of other discrete components to enable controlling of the MOSFET by the integrated circuit, for example. The single-chip device 10 of the present invention has integrated therein all of the required active and/or passive components, which may comprise equal to or less than 15 discrete electronic devices or components integrated in said chip, for example, to enable said device to be provided in a simple and compact, on-chip structure to emulate a diode. As further shown in FIG. 5a, the first MOSFET (M1) is preferably integrated in the single-chip device 10 for vertical operation, whilst all the other components are integrated in the single-chip device 10 to have horizontal operation.

As discussed, the single-chip device 10 is capable of emulating the function of a diode, based on its MOSFET synchronous rectification configuration, which allows the first MOSFET (M1) to go into a conduction phase when its drain electrode is negatively polarized; and to go into a blocking phase, when the polarization of its drain electrode is switched from negative to positive. Specifically, during the conduction phase, the drain-source resistance can be very low which allows the voltage between drain electrode and source electrode of M1 to become very low. In one embodiment, this low voltage, which equals to the forward voltages ($V_f$) of the emulated diode, can be equal to or lower than about 0.3 volt (V) for more than 90% during the on-state period, and preferably less than or equal to about 0.1 volt (V) for more than 90% during the on-state period, and more preferably, in the range of about 80 mV to about 90 mV for more than 90% during the on-state period, for example.

Figure 1:
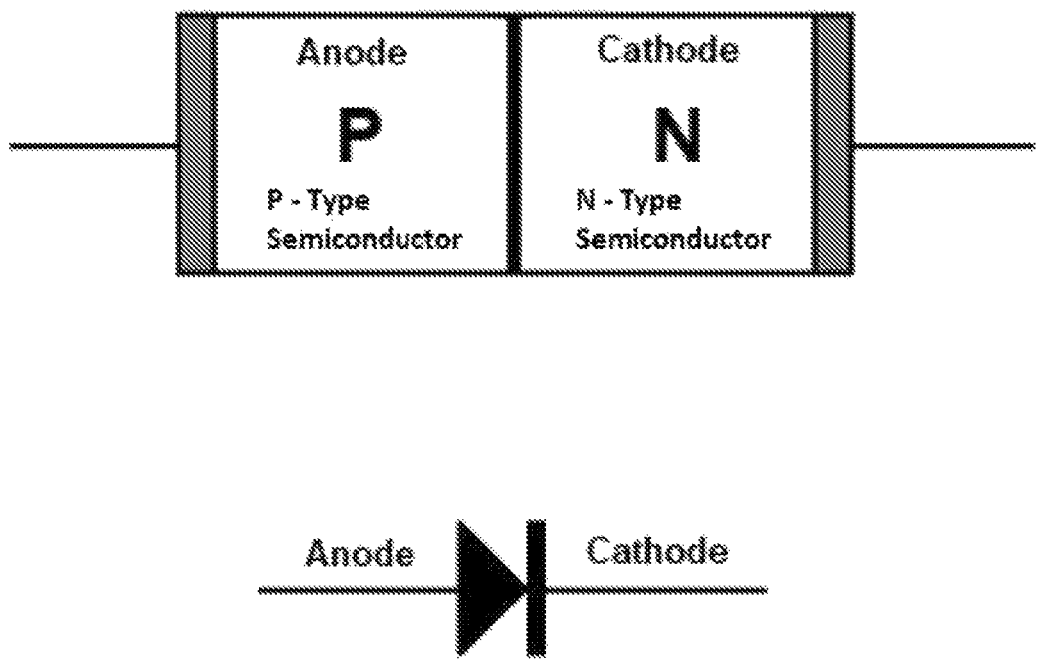
FIG. 1 shows a general structure of a semiconductor diode in the prior art.
Figure 2:
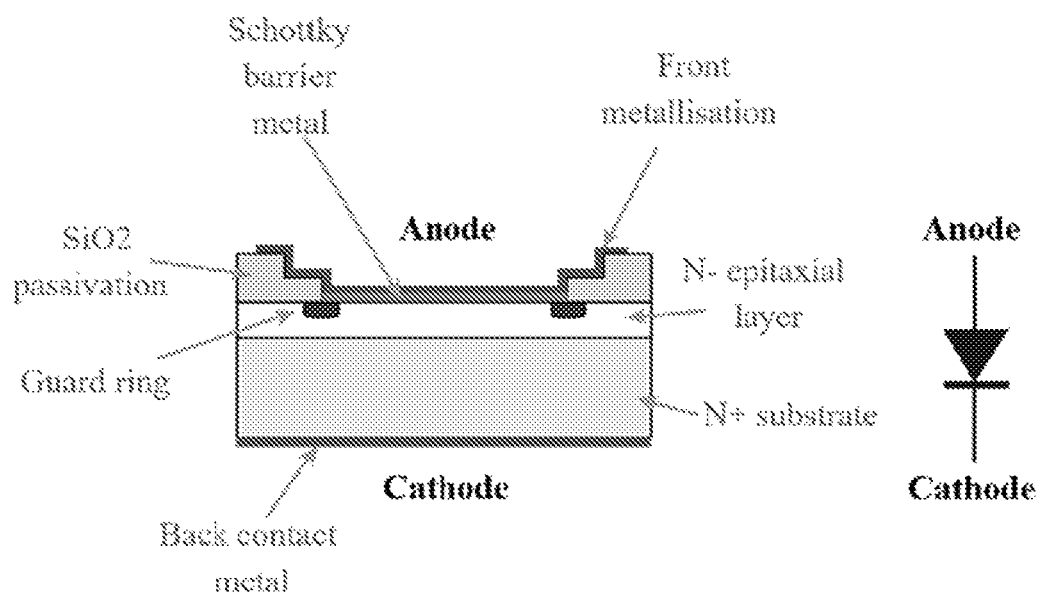
FIG. 2 shows a schematic diagram of a Schottky diode chip in the prior art.
Figure 3:
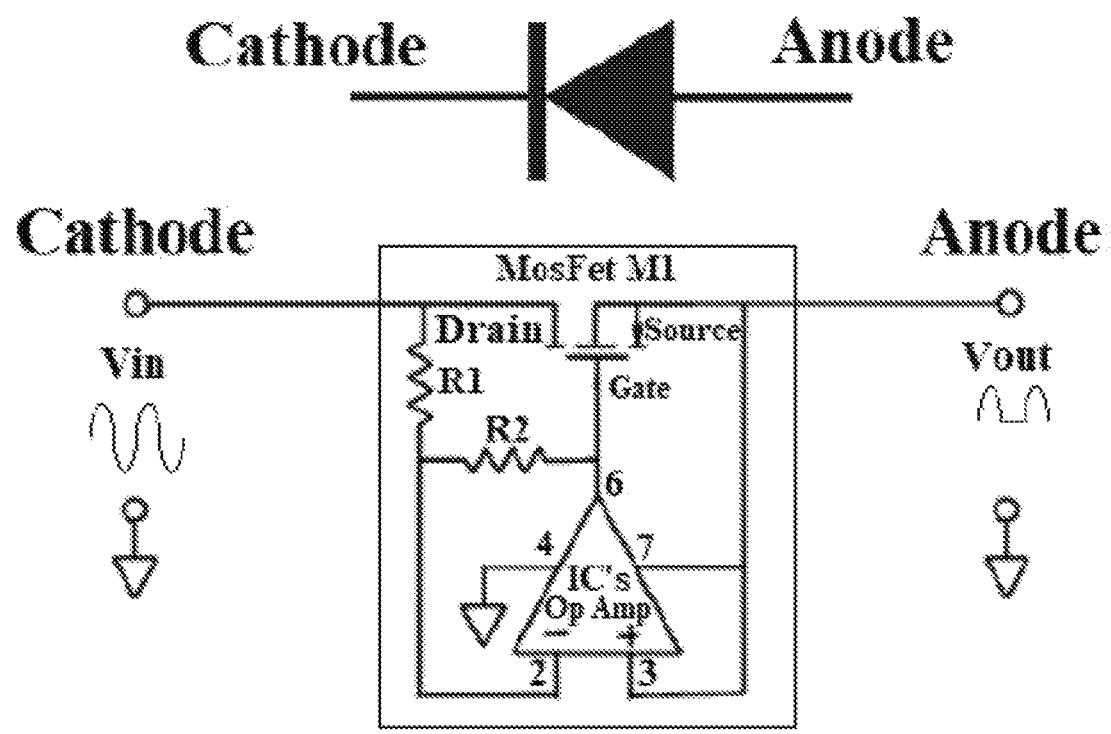
FIG. 3 shows a circuit diagram of a MOSFET synchronous rectifier in the prior art.
Figure 6:
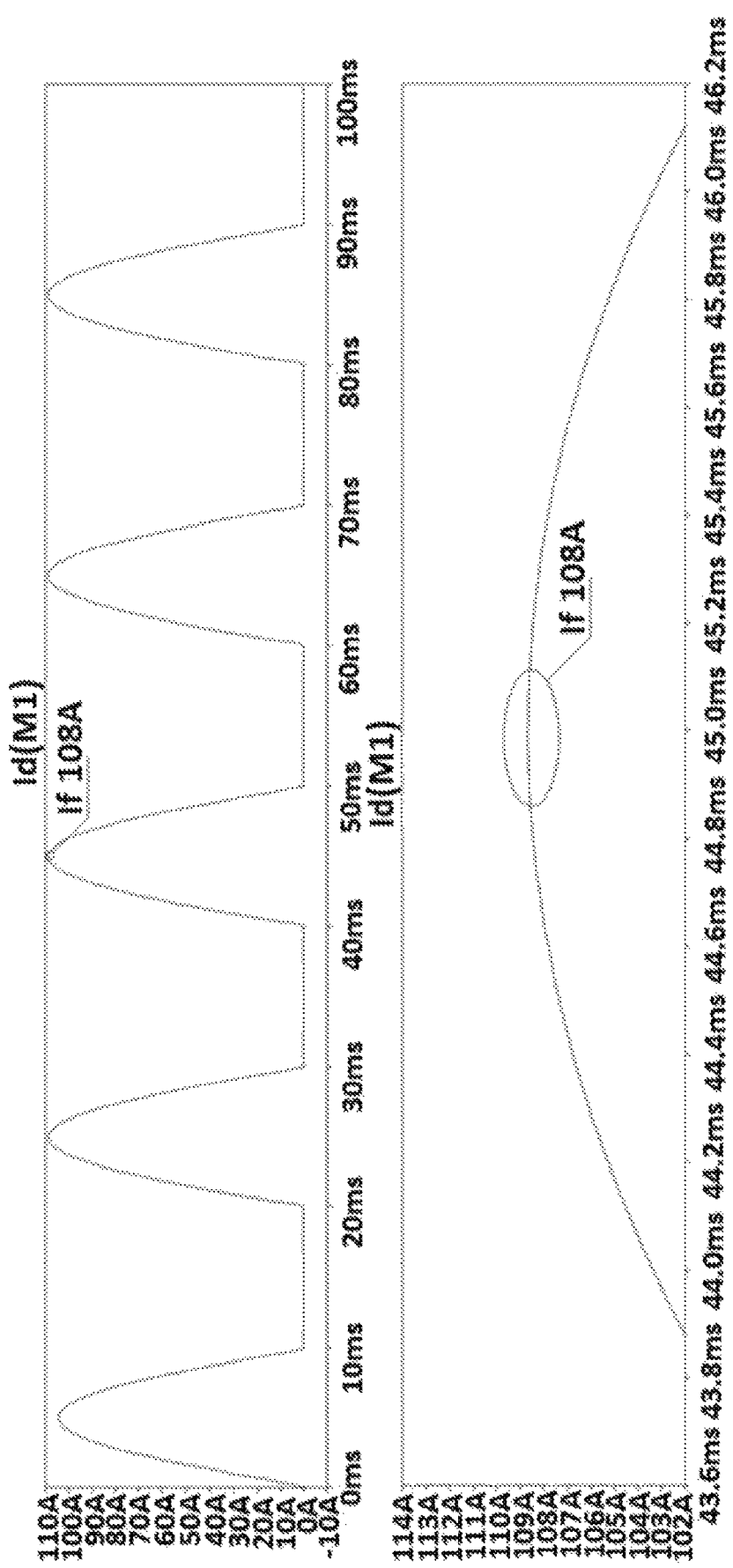
FIG. 6 shows the drain current waveforms of the first MOSFET (M1) emulating the forward current ($I_f$) of the embodied chip device of FIG. 4.
Figure 7:
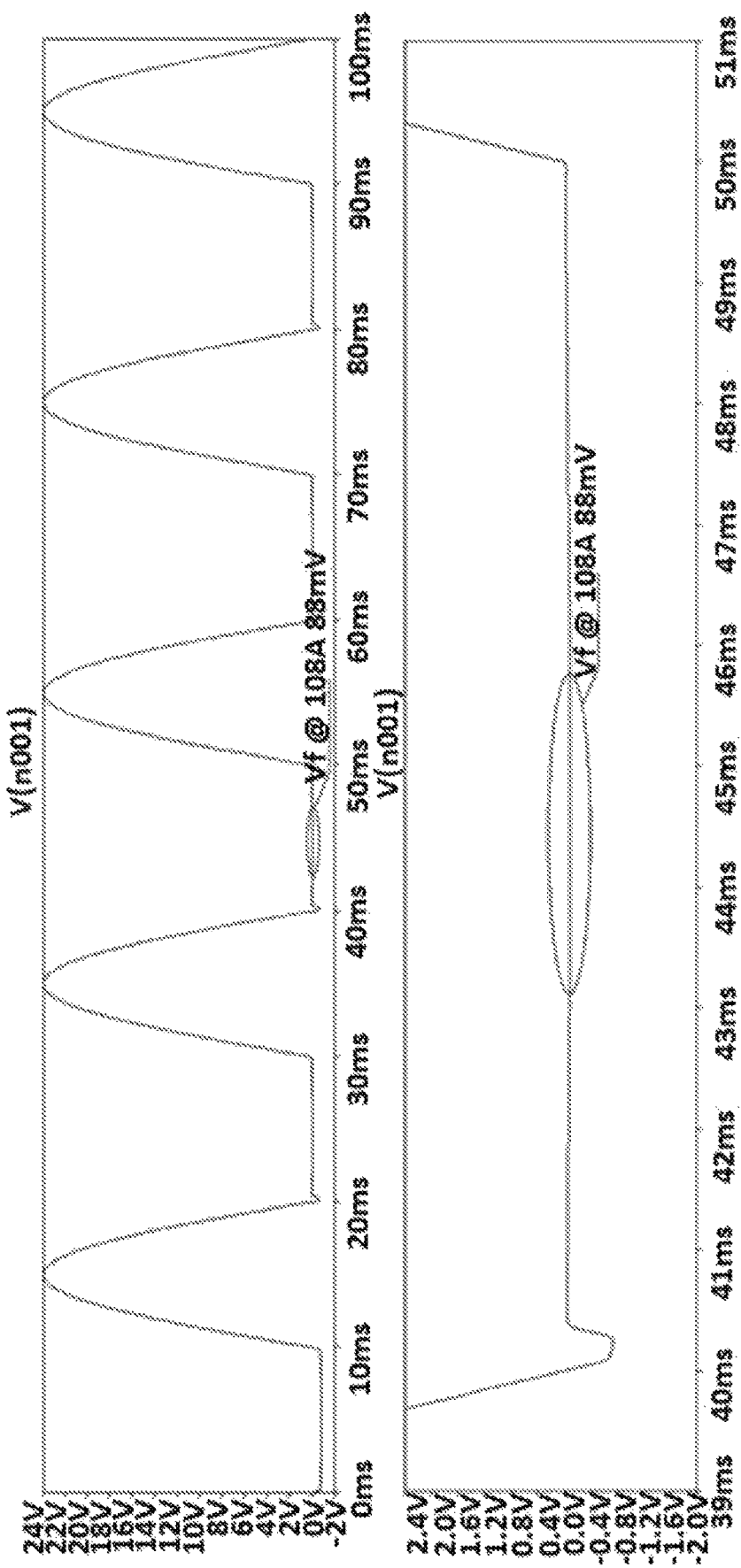
FIG. 7 shows the drain source waveforms of M1 emulating the forward voltage ($V_f$) of the embodied chip device of FIG. 4.
Figure 8:
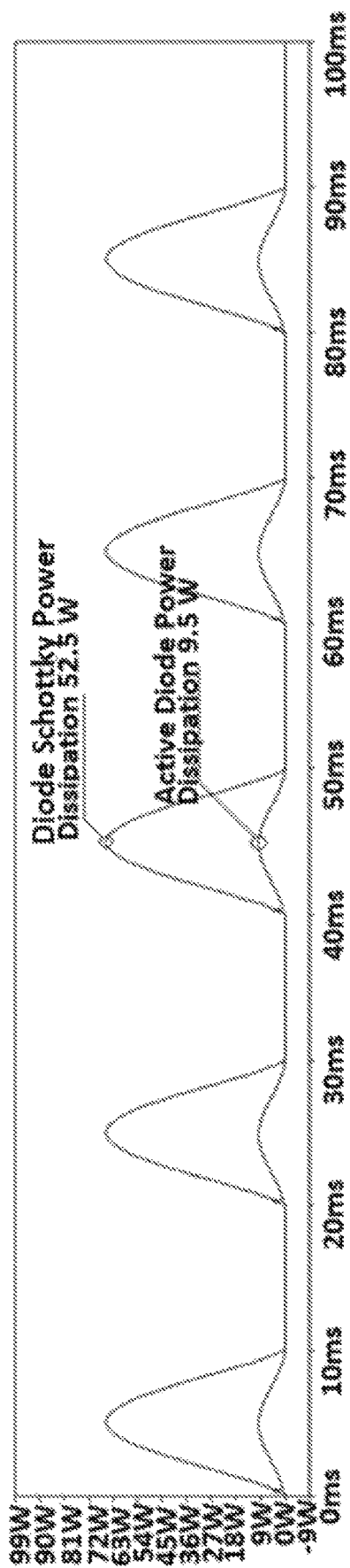
FIG. 8 shows a comparison on the power dissipation waveforms between the prior art Schottky diode as shown in FIG. 2 and the embodied chip device of FIG. 4.

To verify functionality of the single-chip device 10 as an emulator of a diode having a low $V_f$, a series of simulations have been conducted. For example, FIGS. 6 and 7 display the waveforms demonstrated by the emulated diode during the switching periods from on to off when the circuit of the chip device 10 is biased by a sinusoidal waveform generator. FIG. 8 further shows the comparison between the power dissipation waves form of the first MOSFET (M1) of the chip device 10 of the present invention and that of the Schottky diode as shown in FIG. 2. The results clearly demonstrate a significant reduction in power loss achievable by the emulated diode of the present invention. Based on the Ohm's law, the diode-emulating chip device 10 dissipates a peak power loss of approximately about 9.5 W; while an equivalent Schottky diode typically dissipates a power loss of about 52.5 W, which is equivalent to about 5.5 times of the power loss of emulated diode of the present invention.

The present invention is therefore advantageous in that it provides a structurally simple, MOSFET based synchronous rectifier for emulating the function of a diode, of which, when compared to known alternative diode devices, achieves a significantly lower forward voltage drop ($V_f$). Particularly, the present invention makes use of a second MOSFET (M2) to control operation of a first MOSFET (M1) configured in a synchronous rectification setting, which differs to the MOSFET synchronous rectifier of the prior art in which a MOSFET is controlled by at least one separate, operational integrated circuit having a large number of discrete electronic components connected thereto. It has been demonstrated that, for example, for a chip size of smaller than or about 30 mm2, a low $V_f$ value of about 0.3V to 1 V may at best be achievable by a traditional silicon diode and/or a Schottky diode at a high current of above 3A. With the present invention, it is possible to achieve a much lower $V_f$ of lower than or equal to about 0.1V for more than 90% of the on-state period duration under the same conditions, and therefore, a significant reduction in power loss is achieved. The $V_f$ of the present invention is found to be about 5.5 times lower than the traditional Schottky diode, or in other words, a smaller chip size of about 1/5.5 or less would be required by the present invention to provide the same power during operation. The present invention also demonstrates superior performance in having a much lower reverse leakage at high temperature, which prevents thermal runaway when the emulated diode is operated at high temperature. Furthermore, the present invention also allows relatively simple fabrication and/or assembling processes when compared to the processing steps of the Schottky diodes and/or the MOSFET diodes in the prior art, which provides reduction in the associated manufacturing costs.

The present description illustrates the principles of the present invention. It will thus be appreciated that those skilled in the art will be able to devise various arrangements that, although not explicitly described or shown herein, embody the principles of the invention and are included within its spirit and scope.

Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

While the invention has been illustrated and described in detail in the drawings and foregoing description, the same is to be considered as illustrative and not restrictive in character, it being understood that only exemplary embodiments have been shown and described and do not limit the scope of the invention in any manner. It can be appreciated that any of the features described herein may be used with any embodiment. The illustrative embodiments are not exclusive of each other or of other embodiments not recited herein.

Accordingly, the invention also provides embodiments that comprise combinations of one or more of the illustrative embodiments described above. Modifications and variations of the invention as herein set forth can be made without departing from the spirit and scope thereof, and, therefore, only such limitations should be imposed as are indicated by the appended claims.

In the claims hereof, any element expressed as a means for performing a specified function is intended to encompass any way of performing that function. The invention as defined by such claims resides in the fact that the functionalities provided by the various recited means are combined and brought together in the manner which the claims call for. It is thus regarded that any means that can provide those functionalities are equivalent to those shown herein.

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

It is to be understood that, if any prior art publication is referred to herein, such reference does not constitute an admission that the publication forms a part of the common general knowledge in the art.

The invention claimed is:

1. A field-effect transistor (FET) based synchronous rectifier, comprising:
 a first terminal and a second terminal;
 a first EFT (M1) and a second FET (M2),
  wherein the second FET (M2) is adapted to control operation of the first FET (M1) to thereby allow unidirectional current flow when the two terminals are connected with an external circuit;

wherein the FET based synchronous rectifier comprises a fully integrated single-chip device adapted to emulate a diode;

wherein the first FET (M1) has at least a first gate electrode, a first source electrode and a first drain electrode; the second FET (M2) has at least a second gate electrode, a second source electrode and a second drain electrode; the second drain electrode of the second FET (M2) is in series connection with the first gate electrode of the first FET (M1);

a first diode (D1) and a first resistor (R1) connected in series between the second drain electrode of the second FET (M2) and the second terminal; and a first capacitor (C1) connected in series between the first diode (D1) and the second source electrode of the second FET (M2), the FET based synchronous rectifier further comprises a second resistor (R2) and a second diode (D2) connected in parallel with the first capacitor (C1) and the first diode (D1) in between the first terminal and the second terminal, wherein the second resistor (R2) is in series connection with the second gate electrode of the second FET (M2), wherein the second resistor (R2) is directly connected to the second terminal, and the second diode (D2) is directly connected to the first terminal.

2. The FET based synchronous rectifier according to claim 1, wherein the fully integrated single-chip device comprises equal to or less than 15 discrete electronic devices or components integrated in said chip.

3. The FET based synchronous rectifier according to claim 1, wherein the first terminal is provided on a first or top metal surface of the fully integrated single-chip device and the second terminal is provided on a second or bottom metal surface of the fully integrated single-chip device.

4. The FET based synchronous rectifier according to claim 3, wherein the first or top metal surface of the fully integrated single-chip device comprises an anode and the second or bottom metal surface of the fully integrated single-chip device comprises a cathode.

5. The FET based synchronous rectifier for emulating a diode according to claim 1, wherein the single-chip device has only two terminals.

6. The FET based synchronous rectifier according to claim 1, wherein the first FET (M1) comprises a first metal oxide semiconductor FET (MOSFET) and the second FET (M2) comprises a second metal oxide semiconductor FET (MOSFET).

7. The FET based synchronous rectifier according to claim 1, wherein the first FET (M1) and the second FET (M2) are integrated in the single-chip device such that the second FET (M2) comprises a driver for the first FET (M1) to enable said first FET (M1) to operate as a synchronous rectifier.

8. The FET based synchronous rectifier according to claim 1, wherein the second FET (M2) is configured to stay on when a voltage at the first drain electrode of the first FET (M1) is positive, and the second FET (M2) is configured to keep off when a voltage at the first drain electrode of the first FET (M1) is negative.

9. The FET based synchronous rectifier according to claim 1, wherein the second source electrode of the second FET (M2) and the first source electrode of the first FET (M1) are connected with the first terminal.

10. The FET based synchronous rectifier according to claim 1, wherein the first drain electrode of the first FET (M1) is connected with the second terminal.

11. The FET based synchronous rectifier according to claim 1, further comprising a third diode (D3) connected in parallel with the first FET (M1).

12. The FET based synchronous rectifier according to claim 1, wherein the FET based synchronous rectifier, when emulating a diode, demonstrates a forward voltage drop of less than or equal to 0.3 volt for more than 90% during an on-state period.

13. The FET based synchronous rectifier according to claim 12, wherein the forward voltage drop of the emulated diode is less than or equal to 0.1 volt for more than 90% of the on-state period.

14. The FET based synchronous rectifier according to claim 1, wherein the fully integrated single-chip device when operated to emulate a diode does not require to be connected to any one or more of an external power FET, a control integrated circuit (IC) and one or more passive components to control the first FET.

15. The FET based synchronous rectifier according to claim 1, wherein the fully integrated single-chip device has integrated therein all of one or more active and passive components required to enable said device to emulate a diode.

16. The FET based synchronous rectifier according to claim 1, wherein the first FET (M1) is integrated in the single-chip device to have vertical operation whilst all other components being integrated in the single-chip device to have horizontal operation.

17. The FET based synchronous rectifier according to claim 1, wherein the first capacitor (C1) is adapted to serve as a voltage or a current pump, such that the capacitor (C1) is adapted to be charged in the beginning of an input sinusoidal waveforms, and that the voltage charged is then used by the second MOSFET (M2) to drive operation of the first MOSFET (M1).

* * * * *